(12) United States Patent
Canas

(10) Patent No.: US 10,884,067 B2
(45) Date of Patent: Jan. 5, 2021

(54) MODIFICATION OF TEST MEASUREMENT SIGNALS FOR PROTECTIVE DEVICES FOR ELECTRIC POWER NETWORKS

(71) Applicant: SIEMENS AKTIENGESELLSCHAFT, Munich (DE)

(72) Inventor: Federico Canas, Falkensee (DE)

(73) Assignee: Siemens Aktiengesellschaft, Munich (DE)

(*) Notice: Subject to any disclaimer, the term of this patent is extended or adjusted under 35 U.S.C. 154(b) by 152 days.

(21) Appl. No.: 16/178,810

(22) Filed: Nov. 2, 2018

(65) Prior Publication Data

US 2019/0128971 A1    May 2, 2019

(30) Foreign Application Priority Data

Nov. 2, 2017   (EP) .................................. 17199681

(51) Int. Cl.
*G01R 31/40* (2020.01)
*G01R 31/327* (2006.01)
(Continued)

(52) U.S. Cl.
CPC ......... *G01R 31/40* (2013.01); *G01R 31/3272* (2013.01); *G01R 31/3275* (2013.01);
(Continued)

(58) Field of Classification Search
CPC ............ G01R 31/3272; G01R 31/3275; G01R 31/40; G01R 31/08; G01R 31/083;
(Continued)

(56) References Cited

U.S. PATENT DOCUMENTS 5,838,525 A * 11/1998 Ward .................... H02H 7/262
361/69
6,654,220 B2 * 11/2003 Stanimirov .............. H02H 3/40
361/79
(Continued)

FOREIGN PATENT DOCUMENTS

DE   102011075645 A1   11/2012
DE   102012011359    * 12/2013
(Continued)

*Primary Examiner* — Thang X Le
(74) *Attorney, Agent, or Firm* — Laurence Greenberg; Werner Stemer; Ralph Locher

(57) ABSTRACT

An apparatus and a method are described for modifying test measurement signals for protective devices for electric power networks. The apparatus has an input interface to receive a first test measurement signal from a test generator, wherein the first test measurement signal is matched to a first electrical input characteristic of a first protective device for a power network. The apparatus further has an electrical modification system coupled to the input interface to convert the first test measurement signal into a second test measurement signal, wherein the second test measurement signal is matched to a second electrical input characteristic of a second protective device for the power network. The apparatus additionally has an output interface to output the second test measurement signal to the second protective device.

19 Claims, 4 Drawing Sheets

(51) Int. Cl.
*H02H 3/08* (2006.01)
*H02H 3/04* (2006.01)
*G01R 35/00* (2006.01)

(52) U.S. Cl.
CPC ............ *H02H 3/044* (2013.01); *H02H 3/08* (2013.01); *G01R 35/005* (2013.01)

(58) Field of Classification Search
CPC ............ G01R 31/025; G01R 31/021; G01R 31/3004; G01R 31/2805; G01R 31/024; G01R 31/2812; G01R 31/2884; G01R 31/2853
See application file for complete search history.

(56) References Cited

U.S. PATENT DOCUMENTS

| | | | | |
|---|---|---|---|---|
| 8,053,925 | B2* | 11/2011 | Jouper | H02J 1/14 307/39 |
| 2003/0080741 | A1* | 5/2003 | LeRow | H02J 3/38 324/320 |
| 2003/0132753 | A1 | 7/2003 | Lavoie et al. | |
| 2004/0254750 | A1* | 12/2004 | Macfarlene | H05K 3/3447 702/61 |
| 2015/0200534 | A1* | 7/2015 | Nakamura | H02H 3/08 361/18 |
| 2016/0003921 | A1 | 1/2016 | Hensler et al. | |
| 2017/0097379 | A1* | 4/2017 | Kern | G01R 19/2509 |

FOREIGN PATENT DOCUMENTS

| | | | |
|---|---|---|---|
| DE | 102012011359 A1 | | 12/2013 |
| ES | 2170677 | * | 8/2002 |

* cited by examiner

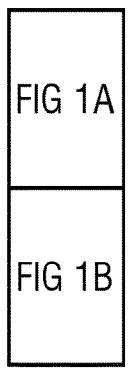
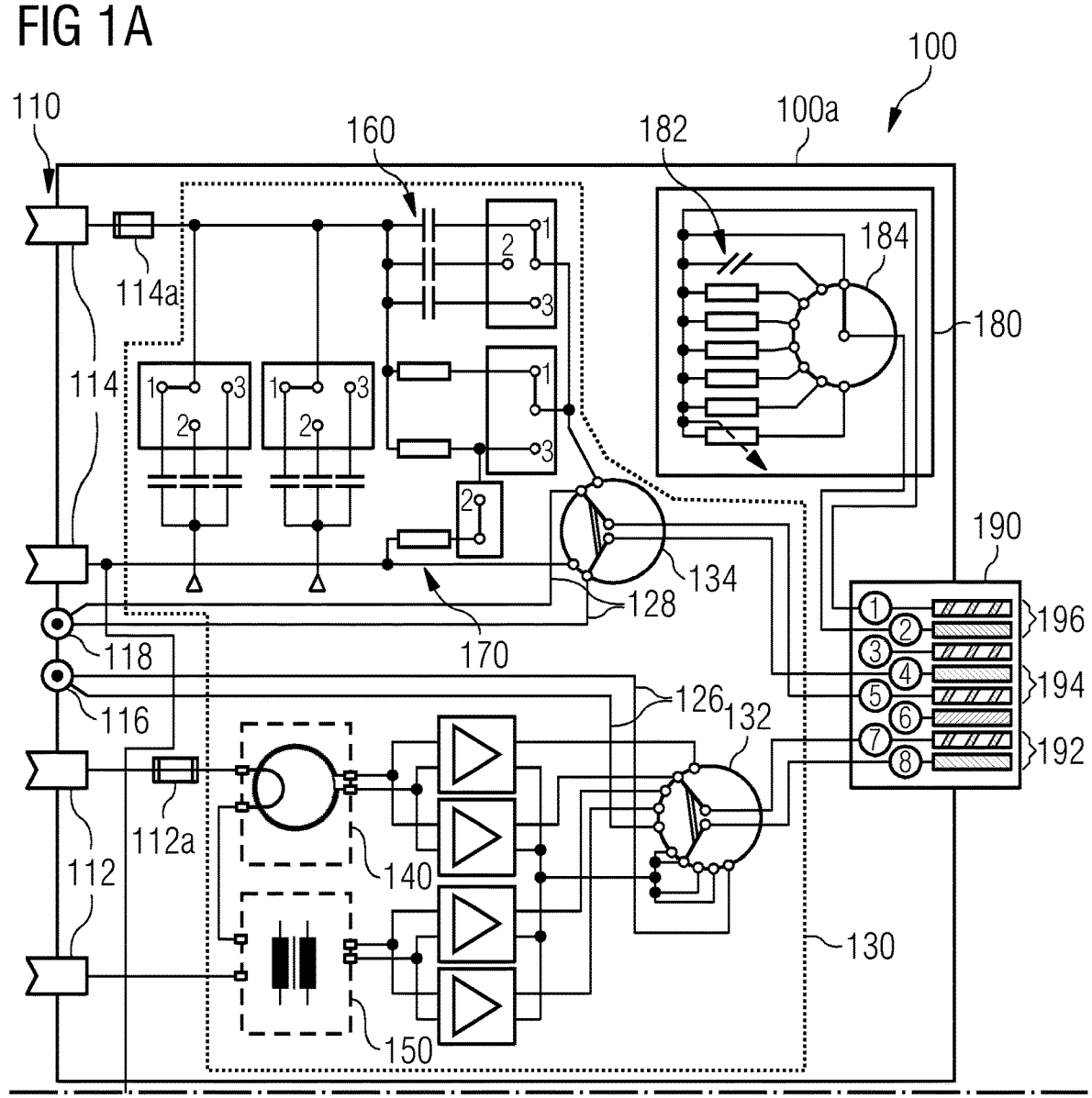

MODIFICATION OF TEST MEASUREMENT SIGNALS FOR PROTECTIVE DEVICES FOR ELECTRIC POWER NETWORKS

CROSS-REFERENCE TO RELATED APPLICATION

This application claims the priority, under 35 U.S.C. § 119, of European application EP 17199681.2, filed Nov. 2, 2017; the prior application is herewith incorporated by reference in its entirety.

BACKGROUND OF THE INVENTION

Field of the Invention

The present invention relates in general to the technical field of electric supply networks or power networks. The present invention relates, in particular, to an apparatus and a method for modifying test measurement signals for protective devices for electric power networks.

Power networks serve to transmit electrical energy from energy supply devices or power stations to electrical consumers. Along with a network of electric power lines, such as overhead lines and underground cables, a power network also contains other electrical devices such as switching stations, transforming stations and protective devices. In the event of a fault in the network, for example a short circuit, a protective device serves, for example, to isolate a part of the power network affected by the fault from the remainder of the network (operating fault-free) and thus prevent more extensive damage to the network and/or to energy feed-in devices connected to the network and/or to electrical consumers.

On the one hand, in order to detect a fault reliably and, on the other hand, to avoid a "false alarm" in relation to a fault, a protective device of this type has not only the actual protective switch, but also a protective electronic system (including software) which does or does not trigger or actuate a protective switch on the basis of sensor signals which indicate current and voltage levels at a specific measuring point of the power network. Variations with time in current and voltage levels can also be evaluated in order to decide whether a fault is in fact present which requires a triggering of the actual protective switch.

The electrical measured quantities of voltage and current which are present at a measuring point of the power network may be very high, for example 380,000 volts (V) or 3000 amperes (A), depending on the respective power network and the present status of the power network. It is therefore necessary to reduce the levels of these measured quantities in a suitable manner so that they can be received by the protective device and can be evaluated by its electronic system. A reduction of this type to measurement signals in the region of 100 V or 1 or 5 A nominal can be performed in a known manner by means of transformers. However, other electrical converters which provide significantly lower measurement signals in the region of a few volts (V) and a few milliamperes (mA) can also be used instead of transformers of this type. Low measurement signals of this type are also referred to in this document as small measurement signals. Converters which provide small measurement signals of this type are also referred to in this document as small-signal converters. Matching protective devices with a correspondingly sensitive electronic system for evaluating small measurement signals are referred to accordingly as small-signal protective devices which have a "small-signal electronic system" (including "small-signal software").

For operational safety reasons, it must be possible to test (small-signal) protective devices of this type and, in particular, their electronic system with precision. It is obvious here that tests of this type are not carried out during live operation. Test generators have therefore been developed which emulate the function of the transformers described above and connected to a power network and which provide artificial test measurement signals which are used to test the protective devices. However, due to their electrical output characteristic, known test generators are not capable of also providing artificial small-measurement test signals for testing small-signal protective devices.

SUMMARY OF THE INVENTION

The present invention is based on the notion of extending the functionality of test generators in a simple manner in such a way that the functional capability of different types of protective devices with different electrical characteristics can be tested.

This object is achieved by the subject-matter of the independent patent claims. Advantageous embodiments, further features and details of the present invention can be found in the dependent claims, the description and the drawing. Features and details which are described in connection with the apparatus obviously also apply in connection with the method and vice versa, so that, with regard to the disclosure of this invention, reference can always be made reciprocally in respect of the individual inventive aspects.

According to a first aspect of the invention, an apparatus is described for modifying test measurement signals for protective devices for electric power networks. The apparatus has (a) an input interface to receive a first test measurement signal from a test generator, wherein the first test measurement signal is matched to a first electrical input characteristic of a first protective device for a power network; (b) an electrical modification system coupled to the input interface to convert the first test measurement signal into a second test measurement signal, wherein the second test measurement signal is matched to a second electrical input characteristic of a second protective device for the power network; and (c) an output interface to output the second test measurement signal to the second protective device.

The described apparatus is based on the notion that the scope of application of a test generator which is configured for conventional (first) protective devices can be extended through the use of the apparatus as a type of adapter in such a way that (second) protective devices or small-signal protective devices can also be tested which require totally different (second) test signals or small-measurement test signals which have a different electrical characteristic for a test procedure. In other words, the described apparatus represents a converter which has an electrical transfer function or which is characterized by such a transfer function which performs an adaptation of the "electrical characteristic" of the test generator to the second protective device or to its protective electronic system. The term "electrical characteristic" includes all parameters which can be described by an electrical transfer function or which can be modified by a converter with an electrical transfer function of this type. In this context, the term "electrical characteristic" can be understood to include not only the strength of the test measurement signal (voltage level and/or current strength). On the contrary, the strength of the output, for example its impedance, which provides the respective signal can also determine the electrical characteristic. An adaptation of the "electrical characteristic" can also represent, for example, an adaptation of a differential or differentiating characteristic of a converter.

In other words, it can be said that, with the described apparatus, which is also referred to in this document below as an adapter apparatus, a compensation for an incorrect adaptation can be carried out which is based on the notion that the transfer functions of different converter technologies differ significantly from one another.

The scope of application of a test generator can be extended by connecting the described adapter apparatus which represents the aforementioned adapter between the test generator and the second protective device as required. If the test generator is configured for a protective device described above and known for some time and the second protective device is a small-signal protective device described above, the described apparatus, as an adapter, performs a suitable modification of the test measurement signal to produce a small-measurement test signal. If a conventional protective device ("non-small-signal protective device") is subsequently to be tested (again), the described adapter apparatus can simply be removed once more and the test generator can be coupled directly to the protective device.

The test generator may be a function generator which provides different variations with time in voltage and/or current signals which represent the first test measurement signals. The variations with time, which will also be referred to below as routines, can be transferred by means of a data processing device, for example a conventional PC, via a suitable data interface to the test generator.

In preferred example embodiments, the output interface may have a socket or a coupling for a data connector, for example an RJ 45 connector. Standardized plug-in connections advantageously enable a simple and reliable forwarding of the second test measurement signals. It should be noted that data interfaces are completely adequate in terms of their dimensioning for voltage and current levels in almost all applications of the described apparatus, since only small-signal converters are emulated. The second test measurement signals are therefore small signals which are sufficiently small in terms of their voltage and also in terms of their current strength so that they can be transmitted fault-free by known data interfaces.

According to one example embodiment of the invention, the electrical modification system is configured to modify an electrical transfer function, in particular to perform an impedance matching, and/or a differential characteristic.

The output interface (for an input of a connected second protective device) has, for example, a matching impedance which differs from the impedance of an output of the test generator (connected to the input interface).

According to a further example embodiment of the invention, the second test measurement signal has a voltage of less than 20V, particularly less than 10V, more particularly less than 5V, more particularly less than 1V, more particularly less than 100 mV, more particularly less than 10 mV, more particularly less than 1 mV, and even more particularly less than 100 µV. Alternatively or in combination, the test measurement signal has a current of less than 20 mA, particularly less than 10 mA, particularly less than 5 mA, particularly less than 1 mA, particularly less than 100 µA, and more particularly less than 10 µA.

The described adapter apparatus can therefore be used to emulate small-signal converters which it will be possible to use increasingly in future instead of the currently most widespread transformers in order to reduce the signal levels of power network measuring devices.

According to a further example embodiment of the invention, the input interface has an input current connection. Alternatively or in combination, the output interface has an output current connection. The input current connection preferably comprises at least two connection terminals. These may, for example, be implemented with simple sockets for banana plugs.

According to a further example embodiment of the invention, the electrical modification system has a circuit which is configured to emulate a current-measuring coil, in particular a Rogowski coil. For this purpose, the circuit may have a current-measuring coil of this type dimensioned in a suitable manner through which the current is carried which is fed into the described adapter apparatus at a first connection terminal of the input current connection and is fed out from the described apparatus once more at a second connection terminal of the input current connection.

In preferred embodiments, the adapter apparatus itself has a current-measuring coil of this type. This can be configured directly on a printed circuit board, wherein conductor paths configured on the surface of the printed circuit board can be used.

According to a further example embodiment of the invention, the electrical modification system has a circuit which is configured to emulate a current transducer, in particular a low power current transducer.

A current transducer of this type can be emulated by a suitably dimensioned transformer which can represent an electrical component of the described apparatus. A low power current transducer can be emulated by a low power current transformer.

In exactly the same way as the current-measuring coil described above, the current transducer can also be connected between the two connection terminals described above of the input current connection. If the current-measuring coil described above is also used along with the current transducer, it is advantageous if the two components, i.e. the current-measuring coil and the current transducer, are connected in series (between the two connection terminals).

The described adapter apparatus may furthermore have a selection switch by means of which it is possible to select whether an output signal of the current-measuring coil or an output signal of the current transducer is forwarded to the output interface. Suitable electrical amplification devices, for example operational amplifiers, can be provided between a switch of this type and the respective component, i.e. the current-measuring coil and the current transducer, in order to amplify the output signals concerned in a suitable manner.

According to a further example embodiment of the invention, the input interface has an input voltage connection. Alternatively or in combination, the output interface has an output voltage connection.

The input voltage connection also preferably comprises at least two connection terminals which can be implemented with simple sockets for banana plugs. One of the two connection terminals can be connected to ground or to a grounding potential.

According to a further example embodiment of the invention, the electrical modification system has a circuit to emulate an electric field probe.

Electric field probes used in high-voltage technology frequently operate as a capacitor which is inserted into the electric field to be measured and is charged therein. An integration of the corresponding charge current then produces a value which indicates the strength of the electric field.

A simple capacitor which is connected between a connection terminal of the input voltage connection can be used to emulate an electric field probe.

According to a further example embodiment of the invention, the circuit to emulate the electric field probe has (a) a capacitor arrangement which contains at least two capacitors; and (b) a capacitor selection unit which is connected in series with the capacitor arrangement between the input interface and the output interface. The capacitor selection unit is configured to modify the effective capacitance of the capacitor arrangement between the input interface and the output interface through a targeted activation or deactivation of a capacitor.

Different electric field probes can be emulated by the described combination of the capacitor arrangement and capacitor selection unit interconnected in a suitable manner. The flexibility of the described adapter apparatus is thereby increased.

The capacitor selection unit can be implemented by means of a selection switch or, if a modification of the capacitance is not intended to be performed very frequently, also by a wiring modification unit, for example a jumper.

According to a further example embodiment of the invention, the circuit to emulate the electric field probe furthermore has a further capacitor arrangement which is connected on the input side to a connection terminal of the input voltage connection and which is connectable on the output side to a further input voltage connection of a further apparatus.

With the described further capacitor arrangement, a crosstalk of an electric field probe between different phases of a power network can be emulated, which is unwanted, but which nevertheless occurs in practice.

The further capacitor arrangement may also have a plurality of (further) capacitors and a further capacitor selection unit so that different effective capacitances can be provided for the capacitor arrangement. A crosstalk in an electric field measurement at different strengths can thus be emulated.

According to a further example embodiment of the invention, the electrical modification system has a circuit to emulate a voltage transducer, in particular to emulate a low power voltage transducer.

The emulation of the voltage transducer and, in particular, the low power voltage transducer can be implemented, in particular, by means of a voltage divider of the described adapter apparatus which is connected between two connection terminals of the input voltage connection. A node between two resistors of the voltage divider is then connected to the output interface.

According to a further example embodiment of the invention, the apparatus furthermore has a temperature sensor emulation circuit which is configured to generate an emulated test temperature measurement signal and transmit it to the output interface, wherein an electrical output characteristic of the temperature sensor emulation circuit simulates the electrical output characteristic of a real temperature-measuring device.

The described temperature sensor emulation circuit can therefore simulate a signal of a real temperature sensor which is present in some protective switch measuring systems in order to determine the temperature at the relevant measuring point of the power network and take this temperature into account in deciding whether the relevant protective switch is to be triggered. The described temperature sensor emulation circuit thus facilitates a more precise testing of the protective devices under more realistic conditions.

The temperature sensor emulation circuit may contain, for example, a circuit with a plurality of resistors, wherein individual resistors which then co-determine the electrical characteristic of the test temperature measurement signal can be activated by means of a selection switch. The circuit may, for example, be a parallel circuit. A specific temperature range can be allocated to each resistor.

According to a further example embodiment of the invention, the input interface furthermore has (a) a further input current connection which is connectable via a current connection line to the output interface so that an input current signal is forwarded directly to the output interface; and/or (b) a further input voltage connection which is connectable via a voltage connection line to the output interface so that an input voltage signal is forwarded directly to the output interface.

A direct electrical connection between the further input current connection or the further input voltage connection and the output interface can be established through an actuation of a selection switch which is located between the further input current connection or the further input voltage connection and the output interface. The components described above of the electrical modification system and, more preferably, the entire electrical modification system are preferably removed from the signal path between the input interface and the output interface through a corresponding actuation of the selection switch.

A direct connection of this type to loop through input signals may be useful, for example, if a conventional protective device ("non-small-signal protective device") is to be tested and the described adapter apparatus is to be left between the test generator and the protective device (and not removed). It is then merely necessary for the test measurement signals generated by the test generator to be connected to the further input current connection of the further input voltage connection.

According to a further aspect of the invention, a system is described for modifying a plurality of test measurement signals for protective devices for electric power networks. The system has a plurality of apparatuses of the type described above.

The described system, which has at least two adapter apparatuses described above and can consequently also be referred to as an adapter system, is based on the notion that a test can be carried out simultaneously at or with different phases of the power network by use of a suitable "parallelization". Each adapter apparatus can be regarded as one channel of the multi-channel adapter system. One channel can be allocated in each case to a selected combination of two phases.

The adapter system preferably has three or four channels. With a three-channel adapter system and a three-phase current, one channel can be allocated in each case to a combination of two selected phases of the three-phase current. With a four-channel adapter system, one channel can be allocated in each case to a selected combination of two lines from a total of four lines, wherein these four lines are allocated to the three phases and to the neutral conductor of a three-phase current network.

According to a further aspect of the invention, a method is described for modifying test measurement signals for protective devices for electric power networks using an adapter apparatus, in particular using an adapter apparatus described above. The method entails (a) feeding a first test measurement signal from a test generator to an input interface of the adapter apparatus, wherein the first test measurement signal is matched to a first electrical input characteristic of a first protective device for a power network; (b) converting the first test measurement signal into a second test measurement signal using an electrical modification system coupled to the input interface, wherein the second test measurement signal is matched to a second electrical input characteristic of a second protective device for the power network; and (c) outputting the second test measurement signal to the second protective device via an output interface of the adapter apparatus.

The described method is also based on the notion that the scope of application of a test generator can be extended through the use of the adapter apparatus in such a way that different types of protective devices can be tested with the test generator. In the case of a (first) type of protective devices, the adapter apparatus is not required. In the case of the (second) different type of protective devices, the adapter apparatus or an adapter system is connected between the test generator and the protective device under test.

Other features which are considered as characteristic for the invention are set forth in the appended claims.

Although the invention is illustrated and described herein as embodied in a modification of test measurement signals for protective devices for electric power networks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1 with its subfigures FIG. 1A

DETAILED DESCRIPTION OF THE INVENTION

It should be noted that the embodiments described below represent only a limited selection of possible embodiment variants of the invention.

Figure 1B:
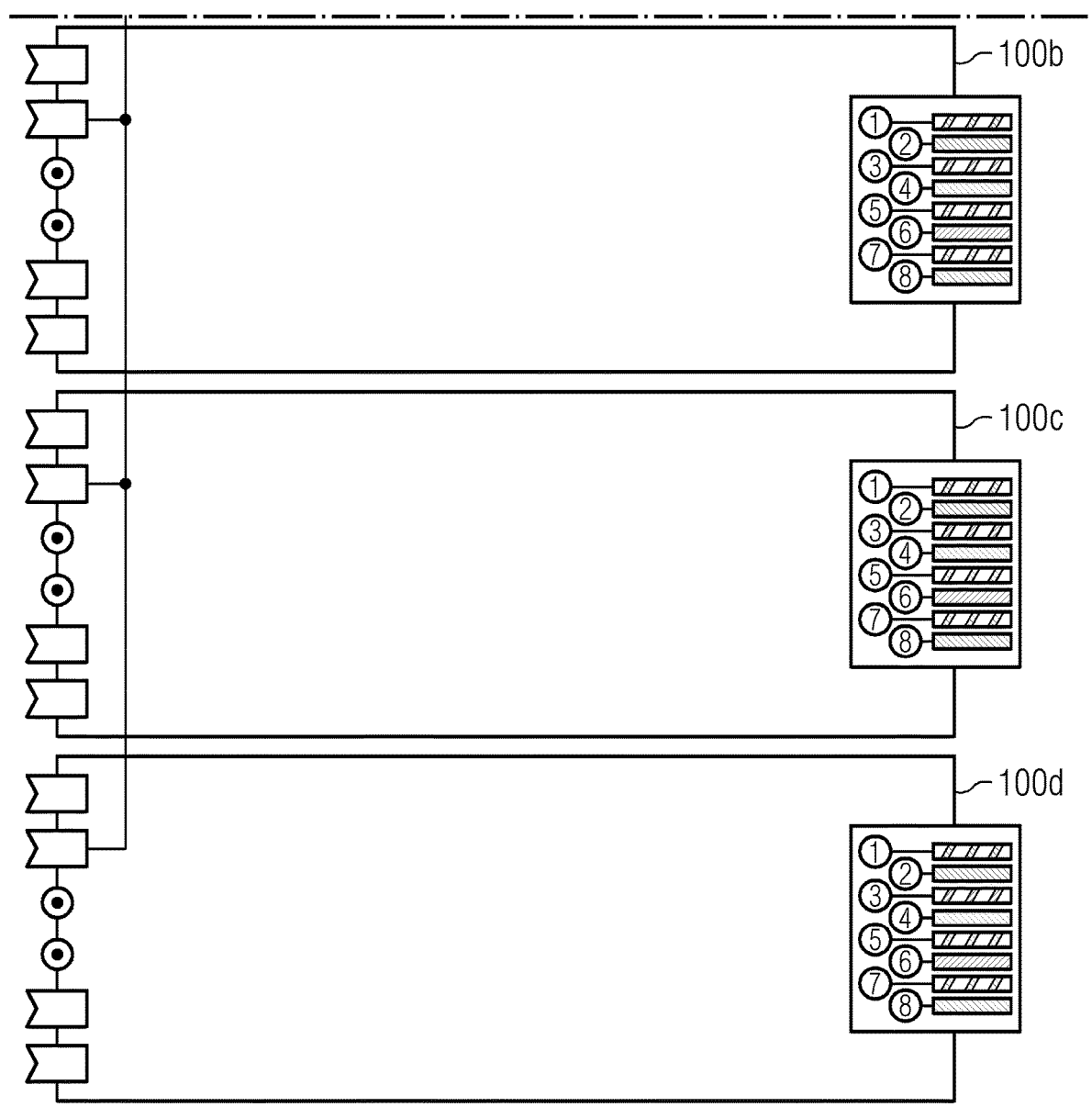
FIG. 1B shows a block diagram of a four-channel adapter system with four adapter apparatuses which in each case have an electrical modification system which is connected on the output side to an input interface and on the output side to an output interface.

Referring now to the figures of the drawings in detail and first, particularly to FIGS. 1, 1A and 1B thereof, there is shown a block diagram of a four-channel adapter system 100 with four adapter apparatuses 100a, 100b, 100c and 100d. In the interests of clarity in the representation, only the first adapter apparatus 100a is shown in detail in FIG. 1A. The other adapter apparatuses 100b, 100c and 100d, which have an identical structure, are merely shown schematically in FIG. 1B without those components which provide the functionalities described below.

The adapter apparatus 100a has an input interface 110 at which test measurement signals can be received from a test generator (not shown) to test protective devices for electric power networks. Test measurement signals modified by the adapter apparatus 100a are output at an output interface 190 to a small-signal protective device (not shown). An electrical modification system 130 which performs the actual modification of the test measurement signals and which is bordered by a dotted line in FIG. 1A is connected between the input interface 110 and the output interface 190.

The input interface 110 has an input current connection 112 which comprises two connection terminals. A fuse 112a which is connected downstream of one of the two connection terminals performs a current limitation in order to prevent damage to at least some components of the electrical modification system 130. The input interface 110 furthermore has an input voltage connection 114 which similarly comprises two connection terminals. A fuse 114a provides protection here also for the electrical modification system 130. The total of four connection terminals of the input current connection 112 and the input voltage connection 114 are configured according to the example embodiment shown here as sockets into which the banana plugs can be inserted.

As shown in FIG. 1A, the input interface 110 furthermore has a further input current connection 116 and a further input voltage connection 118. These connections 116 and 118 which are implemented according to the example embodiment shown here by means of BNC sockets serve to loop test measurement signals received on the input side through to the output interface 190 without a modification by the electrical modification system 130. To do this, a current connection line 126 is provided for current signals, the current connection line being able to forward a corresponding test measurement signal from the further input current connection 116 to an output current connection 192 of the output interface 190 (without a modification of the test measurement signal) via a current selection switch 132 described more precisely below. A voltage connection line 128 is provided in a corresponding manner for incoming voltage signals, said voltage connection line being able to forward a corresponding test measurement signal from the further input voltage connection 114 to an output voltage connection 194 of the output interface 190 (without a signal modification) via a voltage selection switch 134 described more precisely below.

Before the structure and mode of operation of the electrical modification system 130 are explained in detail below, an optional functionality of the adapter apparatus 100a will also be briefly discussed. The adapter apparatus 100a shown in FIG. 1A actually has a temperature sensor emulation circuit 180 by means of which a measurement signal of a real temperature sensor can be simulated, the temperature sensor being present in some protective switch measuring systems in order to determine the temperature at the relevant measuring point of the power network. According to the example embodiment shown here, a platinum measuring resistor is simulated as a temperature sensor with the temperature sensor emulation circuit 180.

As shown in FIG. 1A, the temperature sensor emulation circuit 180 has a resistor matrix 182 containing a plurality of parallel-connected resistors. One of these resistors can be selected in each case by means of a selection switch 184 so that it is connected between two connection terminals of an output connection 196 for test temperature measurement signals, wherein this output connection 196 is integrated into the output interface 190. A specific temperature range is assigned to each of the resistors of the resistor matrix 182 so that a temperature sensor with a specific temperature measurement range can be selected through a suitable actuation of the selection switch 184. The resistors of the resistor matrix 182 may be fixed resistors. Alternatively, variable resistors can also be used, as shown in FIG. 1A for the lowermost resistor of the resistor matrix 182.

The structure and mode of operation of the electrical modification system 130 are described in detail below. As shown in FIG. 1A, the electrical modification system 130 has a current-measuring coil 140 configured as a Rogowski coil by means of which the electrical characteristic of a real measuring coil, in particular a real Rogowski coil, is emulated, of the type used at a measuring point of an electric power network. The electrical modification system 130 furthermore also has a current transducer 150 which emulates a corresponding current transducer of a real measuring system for electric power networks. Since the two components, i.e. the current-measuring coil 140 and the current transducer 150, modify the electrical characteristic of electric currents, they are connected on the input side to the input current connection 112 of the input interface 110. These two components are connected on the output side to the output current connection 192 of the output interface 190, wherein, by means of the current selection switch 132 already mentioned above, it is possible to select whether the electrical characteristic of the output current connection 192 is determined by the current-measuring coil 140 or by the current transducer 150. The current-measuring coil 140 configured as a Rogowski coil and the current transducer 150 and their functions are explained in detail below with reference to FIG. 2.

It is furthermore shown in FIG. 1A that the electrical modification system 130 also comprises two function units which determine the electrical characteristic of the output voltage connection 194 of the output interface 190. These function units are, on the one hand, a circuit 160 to emulate an electric field probe and, on the other hand, a circuit 170 configured as a voltage divider to emulate a voltage transducer. By means of the voltage selection switch 134 mentioned above, it is possible to set which of these two function units is to be connected in an electrically active manner between the input voltage connection 114 and the output voltage connection 194. The circuit 160 and the circuit 170 and their functions are explained in detail below with reference to FIG. 3 and FIG. 4.

Figure 2:
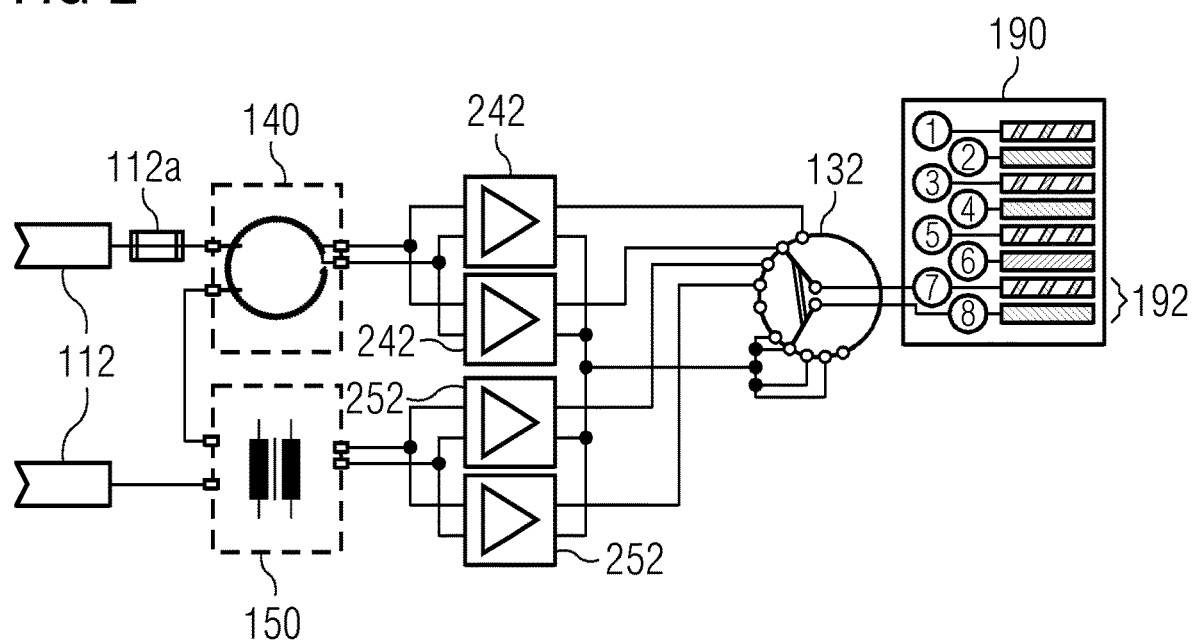
FIG. 2 is a circuit diagram showing the components of the electrical modification system used for an emulation of a current-measuring coil of a current transducer.

FIG. 2 shows the current-measuring coil 140 and the current transducer 150 which are connected in series with one another between the two connection terminals of the input current connection 112. This means that the corresponding input current flows through both the current-measuring coil 140 and (at the same level) through the current transducer 150. According to the example embodiment shown here, the current-measuring coil 140 is a miniaturized coil which is mounted on a printed circuit board (not shown) and emulates a Rogowski coil. A signal output of the current-measuring coil 140 is connected to an amplifier circuit 242 which amplifies the output signals of the current-measuring coil 140 and feeds them to the selected inputs of the current selection switch 132. The output signals of the current transducer 150 are fed in a corresponding manner to an amplifier circuit 252. The corresponding amplified signals are then forwarded to different selected inputs of the current selection switch 132. It is then possible, by means of the current selection switch 132, to set whether the output signals of the current-measuring coil 140 or the output signals of the current transducer 150 are transferred to the output current connection 192 of the output interface 190. It should be noted that the current selection switch 132 can also be set in such a way that, instead of these two output signals, a signal which is fed in at the further input current connection 116 shown in FIG. 1A can also be output at the output current connection 192.

Figure 3:
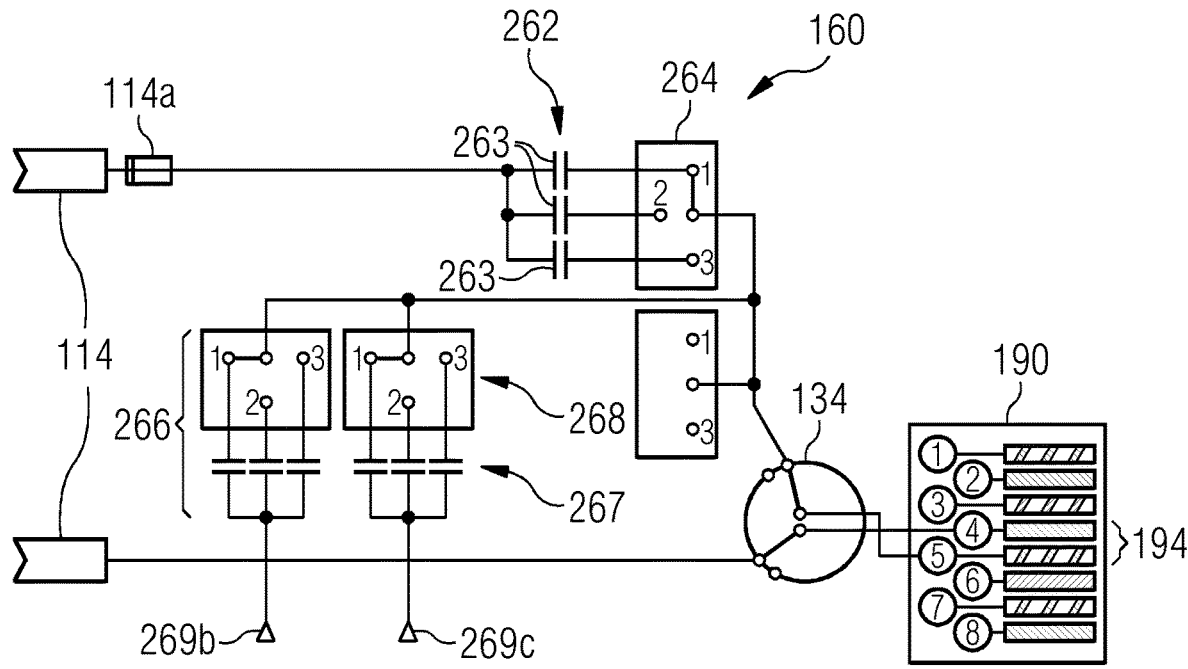
FIG. 3 is a circuit diagram showing the components of the electrical modification system used for an emulation of an electric field probe.

FIG. 3 shows, in an enlarged representation, the circuit 160 of the electrical modification system 130 used for an emulation of electric field probe. According to the example embodiment shown here, a capacitor arrangement 262 which comprises three parallel-connected capacitors 263 is used for this purpose. These capacitors 263 are connected on the input side (via the fuse 114*a*) to a connection terminal of the input voltage connection 114. On the output side, a capacitor selection unit 264 configured as a jumper ensures that a selected capacitor of the three capacitors 263 is connected between the relevant connection terminal of the input voltage connection 114 and the voltage selection switch 134.

According to the example embodiment shown here, the circuit 160 furthermore has a further capacitor arrangement 266 which is similarly connected (in parallel with the capacitor arrangement 262) to the voltage selection switch 134. A crosstalk of a measurement signal of an electric field probe between different phases of a power network can be emulated with this further capacitor arrangement 266. For this purpose, the further capacitor arrangement 266 has two capacitor selection units 268 similarly configured as jumpers to which three of a total of six capacitors 267 are in each case assigned. One of the two capacitor selection units 268 and the three associated capacitors 267 in each case simulate a crosstalk to a specific different phase of the power network since they are connected to a connection terminal of the input voltage connection of a different adapter apparatus. According to the example embodiment shown here, the connection terminal 269*b* is assigned to the input voltage connection 114 of the adapter apparatus 100*b* and the connection terminal 269*c* is assigned to the input voltage connection 114 of the adapter apparatus 100*c*.

Figure 4:
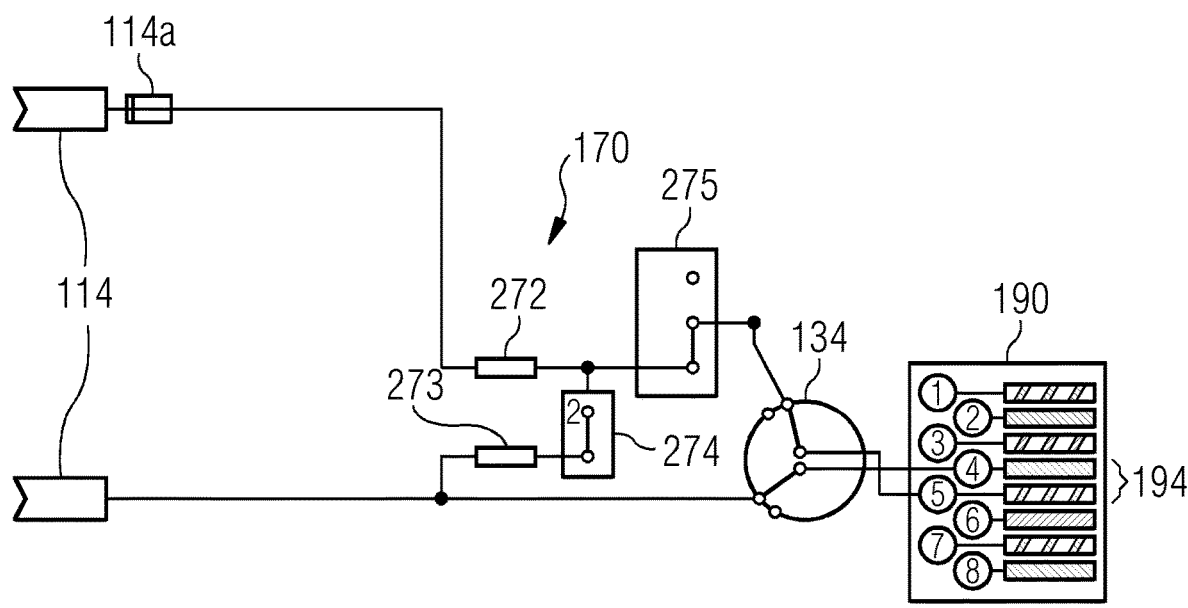
FIG. 4 is a circuit diagram showing the components of the electrical modification system used for an emulation of a voltage transducer.

FIG. 4 shows the components of the electrical modification system 130 used for an emulation of a voltage transducer. According to the example embodiment described here, this emulation is performed essentially by means of a voltage divider which contains two resistors 272 and 273. By means of a suitable wiring, implemented in two wiring modification units 274 and 275 configured as jumpers, it is ensured that the "divided voltage" which is tapped between the two resistors 272 and 273 is present at an input of the voltage selection switch 134. With a corresponding switch setting of the voltage selection switch 134, this voltage is transferred to the output voltage connection 194 of the output interface 190.

The following is a summary list of reference numerals and the corresponding structure used in the above description of the invention:

100 Adapter system
100*a/b/c* Adapter apparatus
110 Input interface
112 Input current connection
112*a* Fuse
114 Input voltage connection
114*a* Fuse 116 Further input current connection
118 Further input voltage connection
126 Current connection line
128 Voltage connection line
130 Electrical modification system
132 Current selection switch
134 Voltage selection switch
140 Current-measuring coil/Rogowski coil
150 Current transducer
160 Circuit to emulate an electric field probe
170 Circuit/voltage divider to emulate a voltage transducer
180 Temperature sensor emulation circuit
182 Resistor matrix
184 Selection switch
190 Output interface
192 Output current connection
194 Output voltage connection
196 Output connection for test temperature measurement signal
242 Amplifier circuit for current-measuring coil output signal
252 Amplifier circuit for current transducer output signal
262 Capacitor arrangement
263 Capacitors
264 Capacitor selection unit
266 Further capacitor arrangement
267 Capacitors
268 Capacitor selection unit
269b/c Connection terminals for input voltage connections of the adapter apparatuses 100b and 100c
272 Resistor of voltage divider
273 Resistor of voltage divider
274 Wiring modification unit/jumper
275 Wiring modification unit/jumper

The invention claimed is:

1. An adapter apparatus for modifying test measurement signals for protective devices, including a first protective device and a second protective device, in electric power networks, the adapter apparatus comprising:
an input interface configured to receive a first test measurement signal, the first test measurement signal being matched to a first electrical input characteristic of the first protective device for a power network;
an electrical modification system coupled to said input interface to convert the first test measurement signal into a second test measurement signal, the second test measurement signal being matched to a second electrical input characteristic of the second protective device for the power network;
an output interface to output the second test measurement signal to the second protective device; and
a temperature sensor emulation circuit configured to generate an emulated test temperature measurement signal and transmit it to said output interface, wherein an electrical output characteristic of said temperature sensor emulation circuit simulates an electrical output characteristic of a real temperature-measuring device.

2. The adapter apparatus according to claim 1, wherein said electrical modification system is configured to modify an electrical transfer function.

3. The adapter apparatus according to claim 1, wherein the second test measurement signal has:
a voltage of less than 20V; and/or
a current of less than 20 mA.

4. The adapter apparatus according to claim 1, wherein said input interface has an input current connection and/or said output interface has an output current connection.

5. The adapter apparatus according to claim 1, wherein said electrical modification system has a circuit which is configured to emulate a current-measuring coil.

6. The adapter apparatus according to claim 5, wherein said circuit is a Rogowski coil.

7. The adapter apparatus according to claim 1, wherein said electrical modification system has a circuit which is configured to emulate a current transducer.

8. The adapter apparatus according to claim 7, wherein said circuit is a low power current transducer.

9. The adapter apparatus according to claim 1, wherein said input interface has an input voltage connection and/or said output interface has an output voltage connection.

10. The adapter apparatus according to claim 9, wherein said electrical modification system has a circuit to emulate an electric field probe.

11. The adapter apparatus according to claim 1, wherein said electrical modification system has a circuit to emulate a voltage transducer.

12. The adapter apparatus according to claim 11, wherein said circuit emulates a low power voltage transducer.

13. The adapter apparatus according to claim 1, wherein said input interface further comprising:
a current connection line;
a further input current connection being connected via said current connection line to said output interface so that an input current signal is forwarded directly to said output interface;
a voltage connection line;
a further input voltage connection being connected via said voltage connection line to said output interface so that an input voltage signal is forwarded directly to said output interface.

14. The adapter apparatus according to claim 1, wherein the second test measurement signal has:
a voltage of less than 100 μV; and/or
a current of less than 10 μA.

15. An adapter apparatus for modifying test measurement signals for protective devices, including a first protective device and a second protective device, in electric power networks, the adapter apparatus comprising:
an input interface configured to receive a first test measurement signal, the first test measurement signal being matched to a first electrical input characteristic of the first protective device for a power network, wherein said input interface having an input voltage connection;
an electrical modification system coupled to said input interface to convert the first test measurement signal into a second test measurement signal, the second test measurement signal being matched to a second electrical input characteristic of the second protective device for the power network, wherein said electrical modification system having a circuit to emulate an electric field probe, wherein said circuit to emulate the electric field probe having a capacitor configuration with at least two capacitors, and a capacitor selector which is connected in series with said capacitor configuration between said input interface and said output interface, said capacitor selector is configured to modify an effective capacitance of said capacitor configuration between said input interface and said output interface through a targeted activation or deactivation of a capacitor; and
an output interface to output the second test measurement signal to the second protective device, said output interface having an output voltage connection.

16. The adapter apparatus according to claim 15, wherein said circuit to emulate the electric field probe furthermore has a further capacitor configuration with an input side connected to a connection terminal of said input voltage connection and an output side connectable on to a further input voltage connection of a further apparatus.

17. The adapter apparatus according to claim 15, further comprising a temperature sensor emulation circuit configured to generate an emulated test temperature measurement signal and transmit it to said output interface, wherein an electrical output characteristic of said temperature sensor emulation circuit simulates an electrical output characteristic of a real temperature-measuring device.

18. A system for modifying a plurality of test measurement signals for protective devices, including a first protective device and a second protective device, in electric power networks, the system comprising:
  a plurality of adapter apparatuses for modifying test measurement signals for the protective devices in the electric power networks, said adapter apparatuses each containing:
    an input interface configured to receive a first test measurement signal, the first test measurement signal being matched to a first electrical input characteristic of the first protective device for a power network;
    an electrical modification system coupled to said input interface to convert the first test measurement signal into a second test measurement signal, the second test measurement signal being matched to a second electrical input characteristic of the second protective device for the power network;
    an output interface to output the second test measurement signal to the second protective device; and
    a temperature sensor emulation circuit configured to generate an emulated test temperature measurement signal and transmit it to said output interface, wherein an electrical output characteristic of said temperature sensor emulation circuit simulates an electrical output characteristic of a real temperature-measuring device.

19. A method for modifying test measurement signals for protective devices in electric power networks using an adapter apparatus containing an input interface, an electrical modification system coupled to said input interface, and an output interface, which method comprises the steps of:
  feeding a first test measurement signal from a test generator to the input interface of the adapter apparatus, the first test measurement signal is matched to a first electrical input characteristic of a first protective device for a power network;
  converting the first test measurement signal into a second test measurement signal using the electrical modification system coupled to the input interface, the second test measurement signal is matched to a second electrical input characteristic of a second protective device for the power network;
  generating an emulated test temperature measurement signal, via a temperature sensor emulation circuit, and transmitting the emulated test temperature measurement signal to the output interface, wherein an electrical output characteristic of the temperature sensor emulation circuit simulating an electrical output characteristic of a real temperature-measuring device; and
  outputting the second test measurement signal to the second protective device via the output interface of the adapter apparatus.

* * * * *